(12) United States Patent
Moore

(10) Patent No.: US 6,411,101 B1
(45) Date of Patent: Jun. 25, 2002

(54) METHOD AND APPARATUS FOR TESTING FREQUENCY-DEPENDENT ELECTRICAL CIRCUITS

(75) Inventor: Anthony James Moore, Cirencester (GB)

(73) Assignee: BCF Designs Limited, Gloucestershire (GB)

( * ) Notice: Subject to any disclaimer, the term of this patent is extended or adjusted under 35 U.S.C. 154(b) by 10 days.

(21) Appl. No.: 09/952,599

(22) Filed: Sep. 12, 2001

Related U.S. Application Data

(62) Division of application No. 09/788,009, filed on Feb. 16, 2001, which is a division of application No. 09/616,543, filed on Jul. 14, 2000, now Pat. No. 6,252,411, which is a division of application No. 09/026,789, filed on Feb. 20, 1998, now Pat. No. 6,121,778.

(30) Foreign Application Priority Data

Jun. 10, 1997 (GB) .............................. 9712051

(51) Int. Cl.$^7$ ............................................. G01R 27/28
(52) U.S. Cl. ..................... 324/619; 324/612; 324/615
(58) Field of Search ................................ 324/619, 612, 324/615; 702/189, 190, 65, 58, 85

(56) References Cited

U.S. PATENT DOCUMENTS

| | | | |
|---|---|---|---|
| 4,039,769 A | 8/1977 | Bradley | 324/619 |
| 4,156,842 A | 5/1979 | Huang et al. | 324/619 |
| 4,275,348 A | 6/1981 | Bayer et al. | 324/619 |
| 4,795,966 A | 1/1989 | Cook | 324/659 |
| 4,816,743 A | 3/1989 | Harns et al. | 324/619 |
| 5,121,063 A | 6/1992 | Kerkow et al. | 324/121 R |
| 5,337,261 A | 8/1994 | Rogers | 324/613 |
| 5,508,607 A | 4/1996 | Gibson | 324/601 |
| 6,121,778 A | 9/2000 | Moore | 324/619 |

FOREIGN PATENT DOCUMENTS

| | | |
|---|---|---|
| DE | 36 29 534 | 3/1988 |
| DE | 3 724 402 | 2/1989 |
| EP | 0 216 941 | 4/1987 |
| EP | 0 349 043 | 1/1990 |
| EP | 0 349 043 | 7/1994 |
| EP | 0 696 742 | 2/1996 |
| GB | 662 707 | 12/1951 |

(List continued on next page.)

OTHER PUBLICATIONS

Derwent Publications Ltd., London, AN 83826072 Verbitskii et al "Induction coils testing device" and SU995019, 1983.

The Radio and Electronic Engineer, vol. 49, No. 12, Dec. 1979, pp. 621–627 by N. Harris "A simple method for swept frequency response testing".

Marconi Instrumentation, vol. 16, No. 2, pp. 44–47 by A.V. Griffiths "Impedance measurements" (published around 1975).

Primary Examiner—Safet Metjahic
Assistant Examiner—Jermele M. Hollington
(74) Attorney, Agent, or Firm—Flynn, Thiel, Boutell & Tanis, P.C.

(57) ABSTRACT

Electrical filter circuits are tested by connecting to the filter inputs without the need to connect to the filter outputs or to disconnect the outputs from a load. A signal generator of known source resistance applies a.c. signals successively over a range of frequencies to the filter inputs, and a voltmeter monitors the voltage across the filter inputs. Different types of filters have different characteristic shapes for the voltage/frequency curve, and processing is applied to the measured results in a computer to determine the location of inflections in the curve and other characteristics of the curve. Methods are disclosed for determining the values of the individual sub-components of the filter. Where the filter is an L-section filter, an interactive process is applied to successively improve the accuracy of the component value determinations. Using the techniques described enables the insertion loss of the filter also to be readily calculated by the computer.

9 Claims, 6 Drawing Sheets

FOREIGN PATENT DOCUMENTS

| | | |
|---|---|---|
| GB | 1 429 858 | 3/1976 |
| GB | 2 015 753 | 9/1979 |
| GB | 2 195 454 | 4/1988 |
| GB | 2 196 745 | 5/1988 |
| GB | 2 251 082 | 6/1992 |
| GB | 2 281 127 | 2/1995 |
| GB | 2 302 595 | 1/1997 |
| WO | WO 95/04935 | 2/1995 |

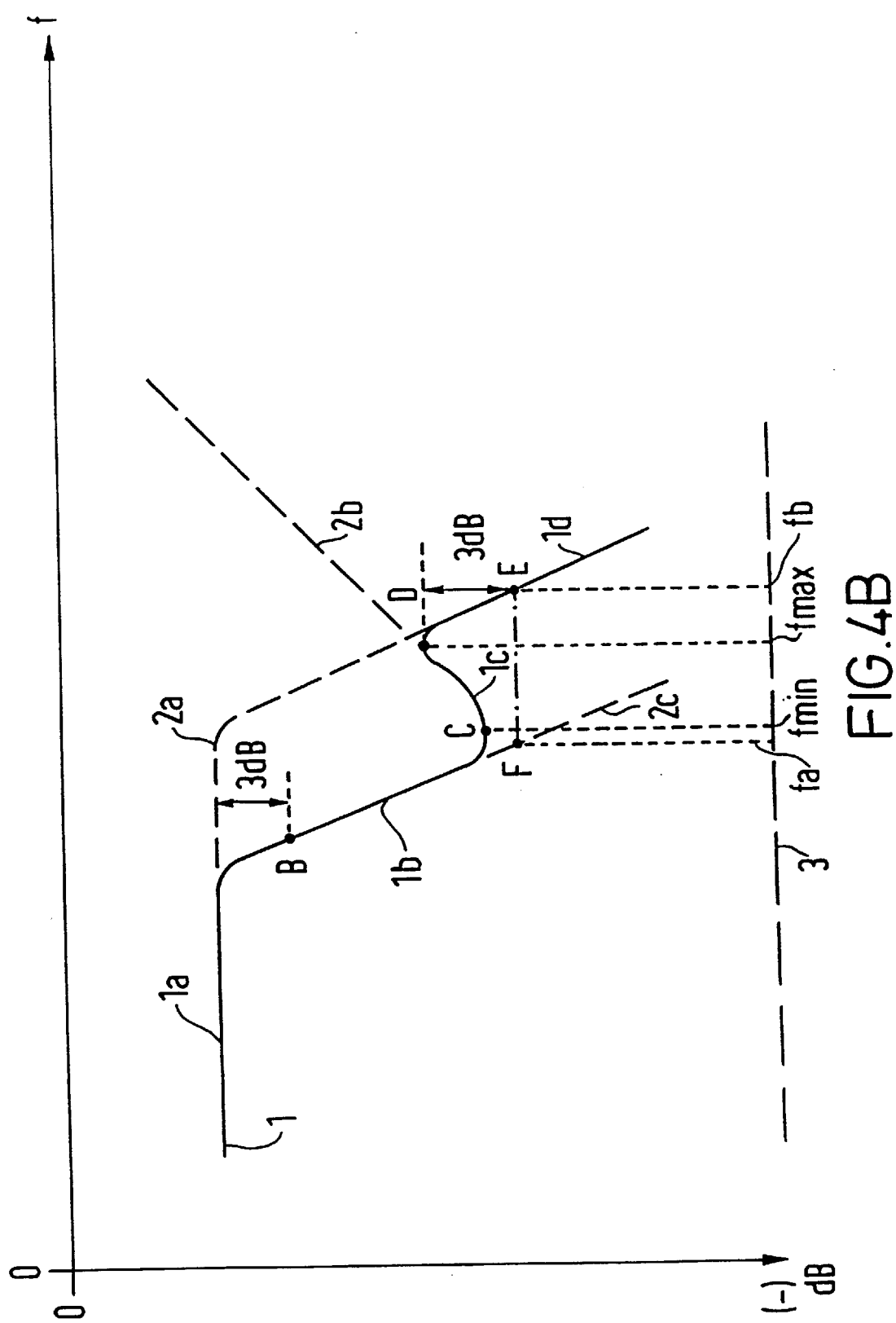

METHOD AND APPARATUS FOR TESTING FREQUENCY-DEPENDENT ELECTRICAL CIRCUITS

This is a division of Ser. No. 09/788,009, filed Feb. 16, 2001, now allowed, which is a division of Ser. No. 09/616, 543, filed Jul. 14, 2000, now U.S. Pat. No. 6,252,411, which is a division of Ser. No. 09/026,789, filed Feb. 20, 1998, now U.S. Pat. No. 6,121,778.

BACKGROUND OF THE INVENTION

This invention relates to methods and apparatus for testing frequency-dependent electrical circuits or circuit elements, particularly for example electrical filter circuits or circuit elements.

Electrical filter circuits often need to be tested, for instance for the purpose of verifying whether they are serviceable or not, i.e. to check their operational integrity, or for the purpose of assessing their electrical characteristics, or both. The usual method of testing such circuits is to apply a.c. (alternating current) input signals of predetermined voltage, e.g. of measured and/or fixed standard voltage, from a low-impedance source, over a range of frequencies, to the input terminals of a filter circuit under test, and to measure the corresponding voltage delivered at the output terminals.

Most methods for determining the frequency response of an electrical circuit rely on measurement of both magnitude and phase information at the inputs and outputs of the circuit in order to derive the frequency and phase response of the circuit. Once input and output measurements have been made it has been possible to estimate the insertion loss of the filter, i.e. ratio of output to input voltages under the test conditions, usually expressed in decibels, and generally as a function of frequency. The insertion loss can give desired information about the integrity or otherwise, and the characteristics, of the filter under test.

However, increasingly there are situations in which it would be desirable to test frequency-dependent electrical circuits, for example filters, but in which the usual method of testing indicated above is not feasible. In modern electronic systems, especially where packaging densities are high, electrical filters are often incorporated in devices. In aircraft for example, the increasing number of pilot and navigator aids, provided by electrical equipment, means that the integration of equipment is advanced, and there is little availability for test points within equipment. Furthermore, once the circuits have been incorporated into a larger piece of equipment it may be advantageous to test the circuit for failure. Situations where it is not possible to have access both to input and to output connections, as would be required in order to carry out the traditional test methods are increasingly commonplace. Often the output side is inaccessible.

The present inventor's International Patent Application No. WO95/04935 discloses a method and apparatus for testing filters and the like in which a.c. input test signals are applied to the input of the filter under test, and measurements are made of the voltage across the input terminals and/or the current through the input terminals, and the integrity of the filter is determined by identifying a characteristic of the resultant measurements. The measurements can simply be compared with those obtained from a sample filter which is known to be good. Alternatively and preferably the measurements obtained are processed to detect expected characteristics of the measurements. This gives an indication as to whether the filter comes up to specification or not.

That system proves to be very effective, but can only identify a faulty unit. We have appreciated that there would be advantages in being able to determine why the unit has failed. In particular, it would be advantageous to determine which of the subcomponents of the filter under test are giving rise to the problem. This would make it possible to repair the unit, and/or would provide the manufacturers with information enabling them to improve the quality of their production by removing frequently appearing faults.

Thus, we have appreciated that it may be desirable to be able to determine the values of selected subcomponents of the filter under test. It may also be desirable to be able to determine the values of characteristics of the filter such as the insertion loss of the filter.

SUMMARY OF THE INVENTION

The invention in its various aspects is defined in the independent claims below, to which reference should now be made. Advantageous features are set forth in the appendant claims.

Preferred embodiments of the invention are described below with reference to the drawings. In these embodiments of the invention electrical filter circuits are tested by connecting to the filter inputs without the need to connect to the filter outputs or to disconnect the outputs from a load. A signal generator of known source resistance applies a.c. signals successively over a range of frequencies to the filter inputs, and a voltmeter monitors the voltage across the filter inputs. Different types of filter have different characteristic shapes for the voltage/frequency curve, and processing is applied to the measured results in a computer to determine the location of inflections in the curve and other characteristics of the curve. Methods are disclosed for determining the values of the individual sub-components of the filter. Where the filter is an L-C filter, an interactive process is applied to successively improve the accuracy of the component value determinations. Using the techniques described enables the insertion loss of the filter also to be readily calculated by the computer.

BRIEF DESCRIPTION OF THE DRAWINGS

Preferred embodiments of the invention will now be described in more detail, by way of example, with reference to the drawings, in which:

FIG. 4B shows the frequency response characteristic of serviceable and unserviceable examples of low-pass pi-section filter circuits or circuit elements are tested;

DESCRIPTION OF THE PREFERRED EMBODIMENTS OF THE INVENTION

General Description

Figure 1:
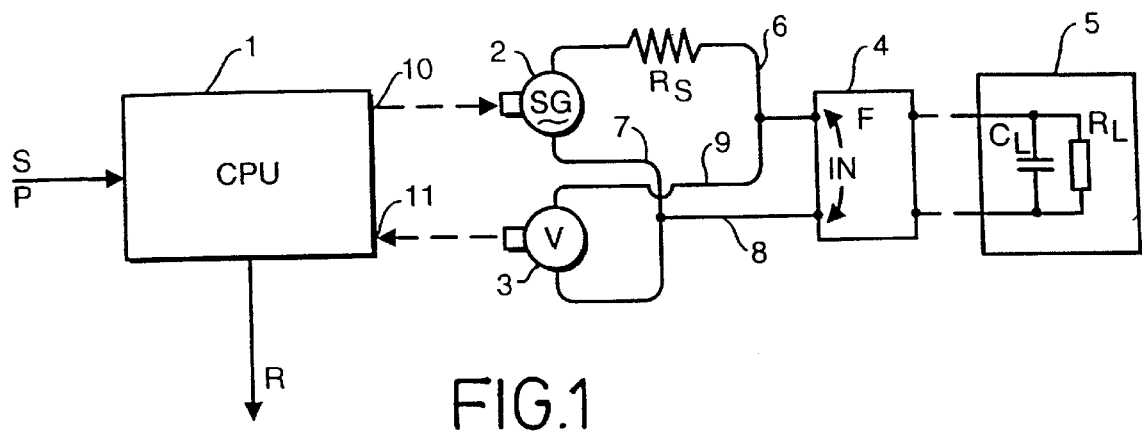
FIG. 1 is a schematic diagram of an arrangement of a computer-controlled test apparatus for testing frequency-dependent electrical circuits or circuit elements, particularly for example electrical filter circuits or circuit elements, according to an embodiment of the invention.

A general description of apparatus embodying the invention and its method of operation will first be given, and then the preferred embodiments will be described more specifically in more detail as to their construction and operation.

One particularly desirable method of obtaining the required measurement is to apply each of a series of a.c. input signals from a signal generator, over a predetermined frequency range, successively to a circuit or circuit element under test. The signal generator forms part of a signal source which is of standard or calibrated or otherwise determinate voltage (at open-circuit) and which also has a known and fixed source impedance (preferably a purely resistive impedance) associated with it. The resulting voltage developed, at each of the series of frequencies, between the terminals or connections made to the circuit or circuit element under test is then measured. Alternatively, the open circuit voltage could be measured using the voltmeter required for measuring the test voltage by switching the filter out of the test circuit.

The source impedance should be effectively constant over the frequency range used for the testing.

For example, a suitable signal source can comprise a variable frequency signal generator of low output impedance, of standard output voltage (or provided with means for measuring or standardising its output voltage), and a fixed impedance, e.g. a resistor, in series with its signal output. A suitable measurement device can comprise a high-impedance digital voltmeter connected across the connections made to the circuit or circuit element under test.

In practice the source impedance, usually pure resistance as far as this can be realised in practice, has a value chosen to make an appreciable difference between the resulting voltage at the connections made to the circuit or circuit element under test, on the one hand, and the open-circuit voltage of the signal source on the other hand. For example (but without limitation) a 50-ohm source resistance can be used for filters which have input impedances, at one or more of their corner frequencies or characteristic frequencies, in the range of a few ohms (e.g. 1–10 ohm) to a few hundred ohms (e.g. 100 ohm to 1 kohm).

The a.c. input signals are chosen so that they cover a frequency range which ranges well to each side of each corner or characteristic frequency of the selected type of circuit or circuit element which is under test, e.g. arrange that includes pass and stop bands. In the case of a single parallel-capacitative filter, or other low-pass filter, the needed range extends well both below and above the corner-frequency of the configuration which corresponds to the time constant of the capacitor in conjunction with the associated source and/or load resistance.

The value of the voltages used is chosen so as to produce minimum active effect in the circuits connected to the output of the filter being tested. These circuits may include active components such as transistors, and thus the voltage applied to the filter is less than 0.7 volts. Preferably the voltage is in the range 0.2 to 0.5 volts, and may conveniently be nominally set at 0.3 volts.

In practice, a useful test method and apparatus catering for a wide variety of important types of filters can utilise a signal generator with a range from about 10 kHz to about 50 MHZ, which can sweep the desired frequency range in suitably chosen linear or logarithmic steps to demonstrate the characteristic under test. Use of a lower frequency at the bottom of the range may be desirable if filters incorporating large capacitance values are to be tested, but the indicated range has been found suitable for most filters encountered in practice.

The data-processing arrangement and identification steps of the method and apparatus embodying the invention can be arranged or performed in any of a number of ways. Examples of such method and apparatus for use with L-C (inductance-capacitance) filters are described below.

Embodiments of the invention can take the form of a computer-controlled test rig comprising a digital computer and a variable-frequency a.c. signal generator, of standard or calibratable output voltage, under program control by the digital computer, and arranged to feed its a.c. signal is through a source resistance to a single pair of connections made to a circuit or circuit element to be tested. A digital voltmeter is arranged to measure the voltage developed across the single pair of connections made to the circuit or circuit element to be tested and to deliver data representing the results of such measurement as input data to the digital computer so as to cooperate with the program control. The computer is arranged under program control to cause a stepwise succession of a.c. signals, of a stepwise succession of frequencies, to be applied to the circuit or circuit element of selected type to be tested, and for the data delivered by the digital voltmeter to be processed so as to provide for the user of the test rig an indication related to the integrity or performance of the circuit or circuit element which is under test.

The diagnostic features of the test data show a dependence upon the type of circuit or circuit element under test, and accordingly it will often be necessary to carry out a different form of comparison or other data-processing for each of several such types. Several representative types of circuit or circuit element, and the characteristic forms of test data given by serviceable and unserviceable examples of each, are described below.

Preferred embodiments of the invention are described in further detail below, but without limitation on the scope of the invention, and with reference to the accompanying drawings.

General Apparatus for Testing Filters

Referring now to the drawings, FIG. 1 shows the arrangement of test apparatus controlled by a central processor unit (CPU) 1 in accordance with one embodiment of the invention. CPU 1 may conveniently be an industry-standard microcomputer such as a personal computer based on a 80386, 80486 or Pentium (Trade Marks) processor and equipped with hardware expansion slots and/or i/o (input/output) ports such as RS-232 ports. Either by hardware expansion cards or by cable links via i/o ports, CPU 1 is functionally linked to control a programmable variable-frequency a.c. signal generator 2 and to receive data from a programmable digital voltmeter 3, preferably under control of menu-driven software arranged to control the computer to carry out the functions described herein.

The connections to the signal generator 2 from the CPU 1, and from the voltmeter 3 to the CPU 1, may be made via an interface (not shown) if necessary. Alternatively an interface sub-routine may be used to allow the CPU to control the signal generator and voltmeter. The signal generator is connected to the two input terminals of the filter 4 to be tested, preferably with a source resistor $R_S$ arranged in series with the signal generator to provide an accurately known and stable source resistance. Alternatively the signal generator may be provided with a suitable internal resistance as standard which may be used allowing the separate external resistor $R_s$ to be omitted from the test circuit.

The voltmeter is also connected to the two inputs of a filter 4 under test. The filter (shown as a functional block) has two input terminals IN and has its output terminals connected to an output or load 5. The load 5 has a load impedance $Z_L$, assumed to comprise a resistor $R_L$ and capacitor $C_L$ in parallel, shown as connected across the outputs of the filter.

If one connector serves several filters, each of these filters may be tested in turn using different pins of the connector. A mechanism for switching the signals between different pin connections enables all the filters to be tested without having to reconnect the test equipment. Preferably routing relays, controlled by the CPU, are used.

In a practical example, the filter may be the filter in a combined filter-connector, that is a connector which incorporates a filter circuit or circuits.

The signal generator 2 can be an industry-standard unit chosen (e.g. from the Hewlett-Packard range) to give an output level in this example of 0.5V RMS (±5%) over the range 10 kHz to 50 MHz, programmable so that the signal frequency is also ±5% relative to nominal programmed frequency. The generator is chosen to give an output which is sinusoidal with good purity indicated by low total harmonic distortion preferably not exceeding −40 dB (decibels), and good linearity over a load impedance range from about 5 ohm to about 100 kohm. The generator is of a type able to drive any impedance value from open-circuit (O/C) to short-circuit (S/C), and whether resistive or reactive, without damage. In the preferred embodiment, the source impedance of the generator is arranged, using either the series, or internal, resistor $R_S$, to be effectively 50 ohm (as purely resistive as can be realised).

The programmable digital voltmeter 3 is an industry-standard unit chosen (e g. from the Hewlett-Packard range) to give RMS (root mean square) voltage detection and measurement over the frequency range 10 kHz to 50 MHz, over a range of levels from 2 mV RMS to 0.5V RMS, with an accuracy preferably from about 1% of measured voltage at maximum level which may gradually increase to 10% of measured voltage at minimum level. A high voltmeter input impedance is desired, preferably at least about 100 kohm shunted by no more than 10 pF capacitance over the usable frequency range. It is preferred that the measurement accuracy is maintained when about 100 different frequency settings are programmed within a period of about 10 seconds.

The arrangements described in this embodiment can conveniently be used for testing filters with capacitive component values up to about 0.5 microfarads ($\mu$F). If larger capacitance values are likely to be encountered, a lower bottom frequency may be used and the signal generator and voltmeter chosen accordingly.

In FIG. 1 the generator 2 and voltmeter 3 are diagrammatically shown connected to the filter 4 under test. Filter 4 may have any load impedance $Z_L$ connected across its outputs, as described above, or the filter may be unloaded and $Z_L$ may be absent. In many practical situations, the output load may be assumed to consist of a capacitor and load resistor arranged in parallel, as shown. This assumption is exploited by the method for determining the filter component values The connections of a filter 4 under test to both the signal generator 2 and voltmeter 3 are made via matched coaxial cables 6,7,8,9 connected as illustrated to the two input terminals of filter 4, via a conventional four-terminal measurement connector configuration (not shown). In practice cables 6 and 9 are constituted by one coaxial cable and cables 7 and 8 by another.

It may be convenient to make these connections switchable, eg. by a bank of programmable relays, to any one of a number, e.g. conveniently 120 in one example, of plug/socket connectors suitable for receiving filters to be tested. Such relays can preferably be subject to operation under software control from CPU 1 in manner known per se.

Especially where such routing relays are used, it can be helpful to take null-signal measurements from voltmeter 3 when all routing relays are left open, and to apply any such null-signal values to compensate the measurements taken when a relay is closed and a circuit or circuit element is under test.

A problem of equalisation tends to occur in connection with the transmission of high-frequency measurement signals along such links. Especially where an example of the system is optimised for cables, filters and/or other components having characteristic impedance of e.g. 50 ohm, the measurement conditions can be controlled or compensated for inequalities in frequency response by carrying out a calibration frequency sweep of the system, (e.g. separately for all relay positions if a bank-switched system is in use), using a standard signal generator level and a pure resistance of e.g. 50 ohm in the place normally occupied by the (or each) filter to be tested, and storing calibration data or compensation data corresponding to the resultant measurements. Any departure from a 'flat' frequency response can then be applied as a factor when data-processing the measurement data obtained under test conditions, to compensate for any inequality of frequency response of the measurement system.

In the preferred embodiment CPU 1 is connected via an output port 10 to a control input of the signal generator 2. The CPU is provided with the necessary interface technique, either an interface sub-routine or a compatible signal generator, to enable the CPU to control the frequency of the output (test) signal applied to the filter 4. Alternatively, the signal generator may be provided by an add-on board within a standard computer, in which case the inputs to the filter 4 are connected directly from the relevant output of the computer.

The digital voltmeter 3 is connected to the input 11 of the CPU, allowing the CPU to read the RMS voltage measured by the voltmeter. Alternatively, exception processing and timers, provided within the computer, may be used to provide RMS detection with suitable software, in which case the filter inputs are connected to the input of the computer via a buffer if necessary.

The CPU 1 is provided with Read Only Memory (ROM) and is programmable memory (not shown). The ROM may contain the operating instructions to the test procedure including different algorithms encompassing all the different types of filter to be supported. Alternatively, the algorithms may be stored on a write protected floppy disk, or magnetic tape, and the CPU provided with a suitable disk drive. It is now preferred, however, that the program is held in a PCMCIA card and the CPU provided with an appropriate card reader. The test results can also be held on the card.

Test Procedure

On initialisation of the test procedure, the user is required to input, for example via a keypad (not shown) associated with the CPU, data commensurate with the type of filter to be tested. This data may be the model number of the filter given in the equipment instruction manual or indicated on the equipment, or alternatively the user may select the filter type from a menu provided on a display (not shown) also associated with the CPU. The CPU then controls which one, or series, of a number of test algorithms, or test sub-routines, are executed in accordance with the filter type.

Regardless of filter type, the CPU initiates a procedure which causes the signal generator to apply a known, and incrementible, frequency sinusoid to the filter. In the embodiments described in detail below, a voltage measurement from the unloaded signal generator is required. Preferably, the voltmeter 3 has been chosen to give a known open-circuit voltage across the test frequency range. If the open circuit voltage of the signal generator varies with frequency, the connections to the filter from the signal generator and voltmeter may be switched to allow the open circuit voltage to be measured.

If routing relays are used, the CPU then causes the required relays to close, connecting the selected filter into the test circuit, and the test voltage, at a first frequency $f_1$ is measured by the voltmeter 3, read by the CPU and stored in programmable memory. The test voltage, frequency of the test signal applied, and open-circuit voltage if necessary, are stored as associated data forming one entry in a data set, or table. The processor then sends a signal to the signal generator to increase the test signal frequency.

At this stage the test may proceed in one of two ways. The processor may commence data processing according to the specified filter type processing on the data as it becomes available, or a complete frequency sweep can be implemented and all the data stored for subsequent processing. In either case the processing principle is the same.

The data is processed to determine whether the voltages measured indicate that the correct frequency response has been observed. If the correct frequency response has indeed been measured, then further data processing, to determine the filter component values and the insertion loss of the circuit, takes place. If the frequency response is found to differ from the correct frequency response, the filter has failed and some limited inferences regarding the type of failure may be provided for the user by a display and/or printout.

The results of the test may be displayed in a number of ways. A visual output display of the frequency response may be provided in the case of filter operational failure. In addition, or alternatively, the display may indicate the result by displaying a text message. If the filter is operational, then the component values and insertion loss will be displayed in numerical form on the display, and/or by a print-out.

The type of data processing depends on the filter under test. In 90–95% of systems employing pre-filtering, or is filtering of the input signal, the filters required are low-pass filters in order to remove high frequency noise. The description below examines the test procedure of the four common types of passive low-pass filters, C-section, L-section, T-section, and pi- (i.e. π) section filters. In principle the method and apparatus may be used to test other types of filter, for example, high-pass or band-pass filters. In these cases the software controlling the data processing would need to be adapted to the specifics of the filter under test.

In use, the processor is provided with input effectively consisting of program software P to perform the functions described herein, and a setting S set by the operator, to correspond to the type of filter to be tested, e.g. one of the types described in connection with FIGS. 2 to 4 below. Setting S then determines which of several variants of the data processing are to be carried out in connection with the test of the filter 4. The computer 1 provides results R in any convenient form, provided by software in manner known per se.

Low-band-pass L-C Filters

Figure 2A:
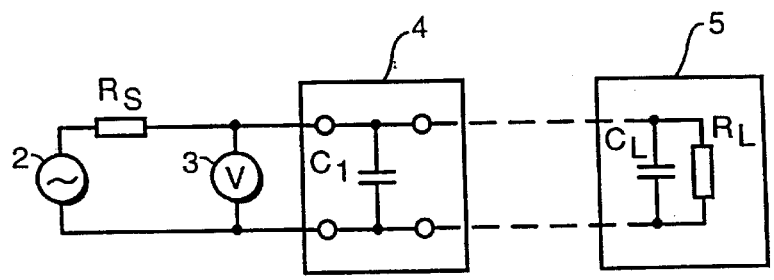
FIG. 2A shows one embodiment of test set-up required to test a parallel capacitive, or C-section, low-pass filter.
Figure 2B:
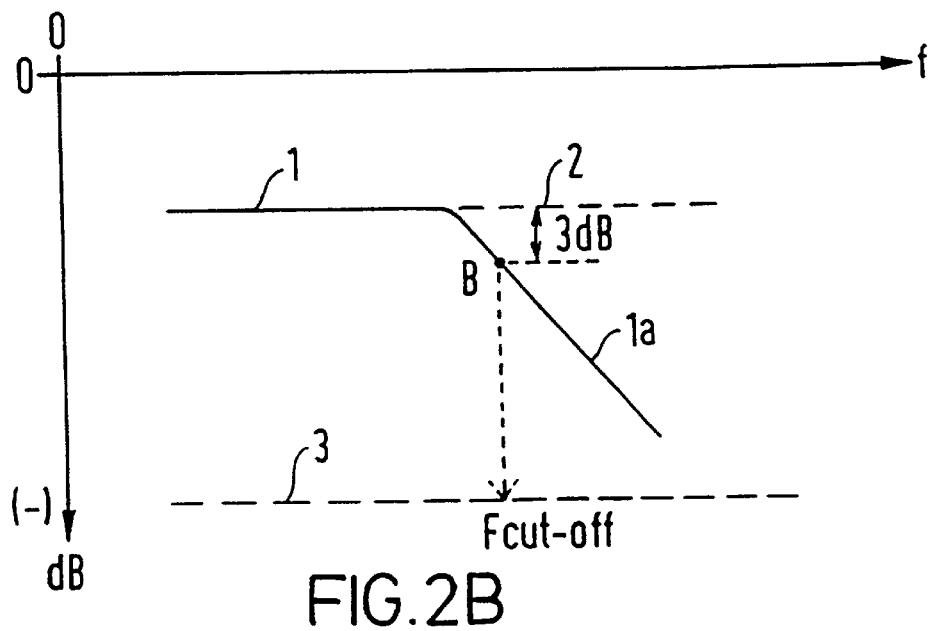
FIG. 2B shows the frequency response obtained when serviceable and unserviceable examples of parallel capacitor filter circuits or circuit elements are tested using the apparatus of FIG. 2A.
Figure 3A:
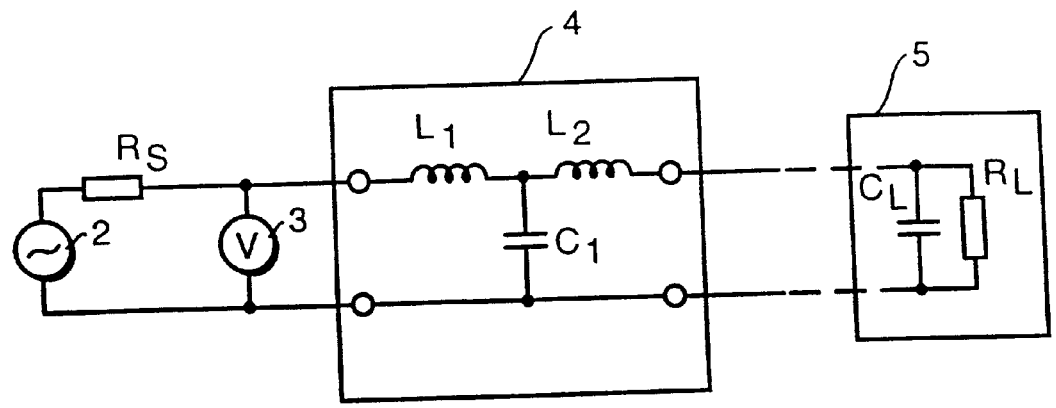
FIG. 3A shows the test set-up for a T-section filter.
Figure 3B:
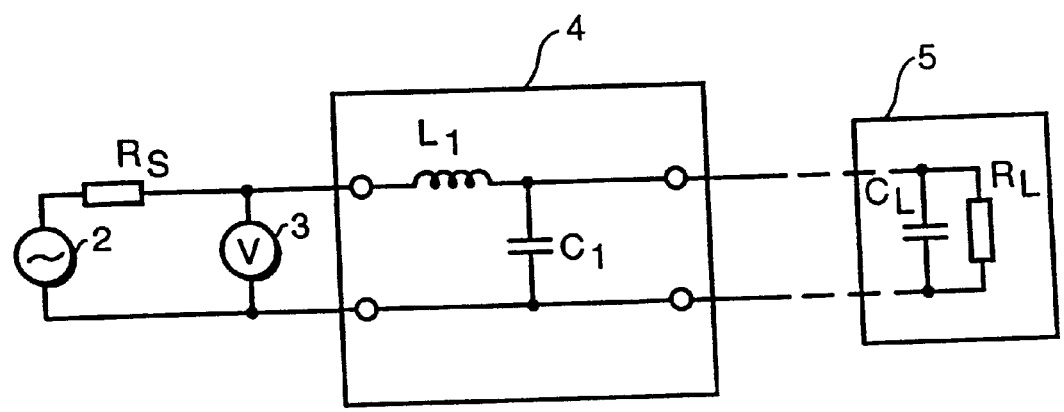
FIG. 3B shows the test set-up for an L-section filter (which is a special case of the T-section filter with $L_2$=0)
Figure 3C:
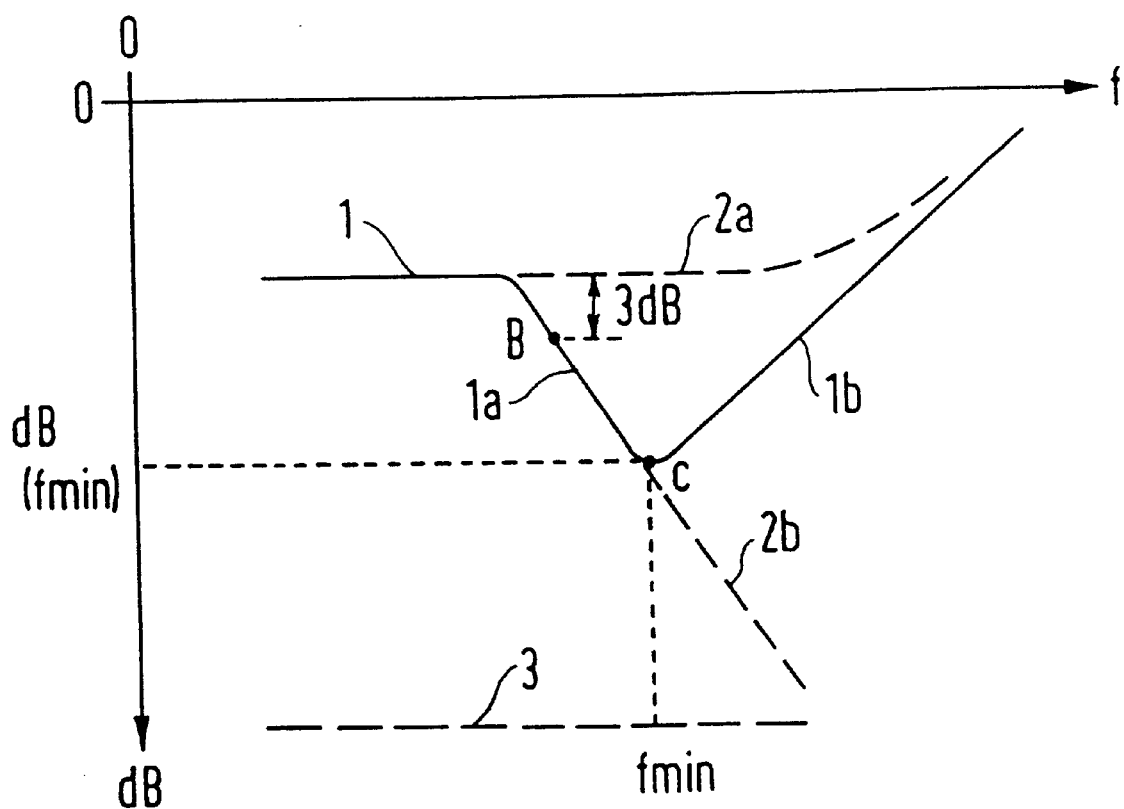
FIG. 3C shows the frequency response characteristic of serviceable and unserviceable examples of low-pass T-section or L-section filter circuits or circuit elements when tested using the apparatus of FIG. 1.
Figure 4A:
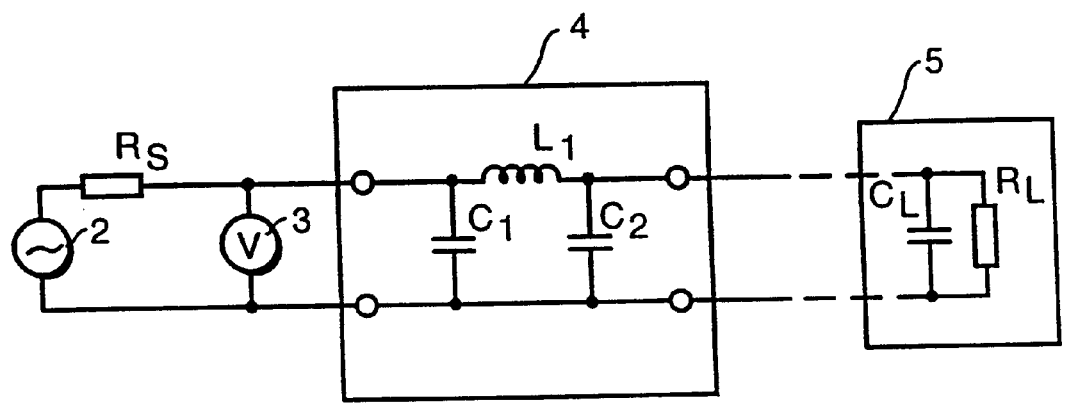
FIG. 4A shows the test set-up required for testing a pi-section filter.

FIG. 2B, FIG. 3C and FIG. 4B show the frequency responses of the filter types shown in FIG. 2A, FIGS. 3A and 3B, and FIG. 4A respectively when the above described apparatus is used to test each type of filter. The forms of the frequency response for these types of filter are well known. The frequency response of the filter is verified by the system and used, as described below, to ascertain the filter component values and the insertion loss of the filter, under the assumption that the load may be modelled as a parallel combination of capacitance and resistance. In practice, this assumption is often valid.

As noted above, the user must input information to the processor which will enable the processor to ascertain the is type of filter, for example a filter model number displayed on the equipment may be entered which the processor can identify from a look-up table.

The system uses the recognition of the shape of the frequency response to determine whether the filter is operational. If the operation of the filter is verified, the component values and finally the insertion loss of the filter are estimated. If the filter has failed, the processor can determine from the frequency response that the filter has failed, and provide some information regarding the type of failure, that is, as to which components in the filter have become open-circuit or short-circuit.

The raw RMS voltage readings are first converted by calculating the ratio of the test voltage to the open circuit voltage, and expressing the result in decibels. The converted voltage reading is associated with the logarithm of the test frequency, thus forming a data set. The data sets may be used to plot a frequency response on a logarithmic-logarithmic scale of voltage ratio (in decibels) versus frequency. However, the verification of the frequency response, and subsequent data processing required to estimate the filter components and the insertion loss of the filter, is performed by mathematical processing of the data set by a computer using an iterative method to estimate the filter components. The test apparatus may be used to test capacitive and LC filters which on their output sides are either unloaded, or loaded where the load may be modelled by a resistor and capacitor arranged in parallel. The overall load impedance is denoted $Z_L$. However, the main features of the frequency response, such as curve 1–1a in FIG. 2B, defined by the overall shape of the frequency response, are substantially unaffected over a range of load conditions. It is, therefore, generally unnecessary to have prior knowledge of the nature or magnitude of any such load impedance.

If the load comprises active components, the filter should be tested with the load unpowered. It is an aim of the invention that the test may be performed in situ. In practice, therefore, the environment should preferably be as noise-free as possible during testing and surrounding electrical equipment should normally be unpowered.

Characteristic Frequency Response of a C-section Filter

FIG. 2A is a circuit diagram of the system when the filter being tested is a C-section or parallel capacitive filter. The capacitance is shown as $C_1$ in filter 4 in FIG. 2A.

FIG. 2B shows the frequency response obtained when serviceable and unserviceable examples of a parallel capacitive filter, or C-section filter, are tested using the apparatus of FIG. 1. The function:

$$|20 \times \log_{10}(Z_L/(Z_L+R_S))|$$

(ordinate) against the logarithm of frequency (abscissa, with high frequencies to the right in the diagram of FIG. 2B) is plotted to give the frequency response of the filter, where $Z_L$ is the parallel impedance of $C_1$, $C_L$ and $R_L$ (as shown in FIG. 2A) at any frequency, in series with the source resistance $R_S$.

Curve 1–1a of FIG. 2B shows the characteristic frequency response for an operational C-section filter. If capacitor $C_1$ is faulty and open-circuit, then the response of the filter under test is independent of frequency and the falling portion of the normal characteristic, i.e. curve portion 1a, is replaced by curve portion 2. If, on the other hand, the capacitor is faulty and short-circuit, the response is again frequency independent but the overall resistance of the filter is lower, causing curve 1–1a to be replaced by curve 3.

In order to determine the serviceability of the filter the data processing is arranged to discriminate between curves of the types 1, 2 and 3, and thereby to provide an output which is indicative of the state of the component under test, whether it is serviceable, open-circuit or short-circuit.

Testing C-section Low-pass Filters: Measurement

The data processing software, when set to examine a filter of this type, is arranged to analyse a data set of number-pairs each representing a point on one of the curves 1, 2 or 3 of FIG. 2B. These number-pairs result from applying a.c. signals of a range of frequencies, at standard voltage, to the C-section filter under test. As noted above, each number-pair consists of a digital numerical representation of one of the several test frequency values, paired with a digital representation of the corresponding voltage measurement made by voltmeter 3 across the input of the filter 4 when the signal of that frequency is applied.

With the filter 4 electrically isolated from the signal generator 2, ie switched out of the circuit for example using routing relays, the processor reads the value of the voltmeter 3 using a suitable interface detector sub-routine, and this value is stored by the processor as the open circuit voltage. If the open circuit voltage alters with frequency, either measurements must be taken at each test frequency or the manufacturer's handbook must be consulted in order to obtain open circuit voltages at the test frequencies. The filter is then connected into the circuit using an interface relay sub-routine controlled by the processor.

The test voltage across the input terminals of the filter 4 is then measured using the voltmeter 3. The CPU 1 reads the RMS voltage across the input terminals of the filter from the voltmeter and stores the result in association with the frequency, and if necessary with the open-circuit signal voltage at that test signals frequency. The CPU 1 then sends a control signal, generated in accordance with appropriate interface generator sub-routines, to the signal generator 2 to increase the frequency of the output sinusoidal waveform, and the new test voltage is measured, and the value stored. In practice, the test voltages at each of a range of test frequencies are usually stored in an array in ascending frequency order, each voltage being implicitly linked to a test frequency.

The test may proceed in one of two ways; either a complete frequency sweep is made, or the frequency sweep may be limited by the results of earlier data processing. If a complete frequency sweep is to be made then the above measurements are repeated at increasing frequencies and the entire set of results is obtained prior to any data processing. In one example the increasing test frequencies may be the logarithmic progression 31.62 kHz, 100 kHz, 316.2 kHz, 1 MHz, 3.16 MHz, 10 MHz and 31.52 MHz. However, limited data may provide enough information to determine, and verify, the shape of the filter, and it may prove more efficient to introduce an element of data processing during the testing procedure. In either case, further measurements, tailored to the specific type of filter, are required.

Estimation of the Cut-off Frequency

The basic testing and processing procedure for finding the cut-off frequency of the filter is the same for C-, L-, T- and pi-section low-pass filters. Subsequent processing, to verify the characteristic frequency response for L-, T-, and pi-section filters is required prior to estimation of the filter components. The method below assumes a nominal datum frequency of the test signal of 10 kHz. In practice, this datum frequency is chosen with regard to the signal generator. Frequency steps are also chosen with regard to the signal generator. It is a simple step to adapt the is method to accommodate any test frequencies. The example below is illustrated with a limited set of readings determined at frequencies of 10 kHz, 31.62kHz, 100 kHz, 316.2kHz, 1 MHz, 3.162MHz, 10 MHz and 31.62MHz. In the presently preferred embodiment, however, 131 frequency settings are used at closer spacings over the frequency band of 10 kHz to 50MHz. This allows the data to be smoothed, using known windowing techniques, and improves the detection of the turning points for the pi-section filter using the differencing method described below. The frequencies are chosen to be substantially equally spaced on a logarithmic scale.

Assuming the more-limited frequency set is used, once readings of the test voltages, and if necessary the open circuit voltages, at frequencies of 10 kHz and 31.62kHz have been obtained, the ratio of the test voltage $V_T$ to the open circuit voltage $V_{OC}$ each frequency is estimated in dB, ie the ratio $20\log_{10}(V_T/V_{OC})$ dB is estimated. If the difference between the ratios obtained at 10 kHz and at 31.62kHz is greater than 3 dB, then it is assumed that the cut-off frequency has been exceeded, and an estimate of the actual cut-off frequency can be made by interpolation between the measured data sets. If a sufficiently large number of steps are used, interpolation may not be necessary. If the difference is less than 3 dB, the cut-off frequency has not been reached and the processor sends a signal to the signal generator to increase the frequency of the test signal to say 100 kHz. The new open circuit and test voltages are measured and stored. The ratio between the test voltage and the open circuit voltage at 100 kHz is now calculated, and compared with the 10 kHz datum value.

The test frequency is increased in this way in predetermined steps, until the difference between the latest voltage ratio and the 10 kHz (or datum) voltage ratio is greater than 3 dB. In practice it may be that none of the test frequencies chosen precisely coincide with the cut-off frequency because of the finite step sizes. The CPU, therefore, interpolates between the data points to find the cut-off frequency. Denoting the lowest test frequency at which the voltage ratio is more than 3 dB less than the datum frequency voltage ratio as Fm, and the voltage ratio at Fm as dBm, the cut-off frequency, $F_{3dB}$, is found in accordance with equation (1):

$$F_{3dB} = F_M \frac{1}{\left(\frac{1}{y^2} - 1\right)^{\frac{1}{2}}} \text{ where } y = \text{antilog}_{10} \frac{dBm}{20} \quad [\text{Equ (1)}]$$

Failure Modes for C-section Filters

If, at any test frequency, the measured test voltage falls below 10 mV (RMS), or the ratio of test voltage to open circuit voltage is estimated to be greater than 34 dB, then the test is deemed to have failed. There are three types of fault which could cause this result: the filter load resistance is below 1 ohm and is outside the specification of the instrument, the capacitance of the filter is greater than 17 μF and is outside the specification of the instrument, or the capacitor has gone short circuit. In any of these circumstances, the frequency response is not of the characteristic form. If the frequency response of the filter is not of the expected form, calculation of the filter components and insertion loss are impossible. However, the user is alerted to the failure of the unit, allowing it to be replaced.

Limitations of Test Equipment

Since a signal generator generally has, a maximum frequency of 50 MHz, the detection of the capacitance values is are limited by the filter load impedances. AS a general guide, for a maximum frequency of 50 MHz and a filter load impedance greater than 50 ohms, the minimum filter capacitance that can be detected is 150 pF; for a filter load of 10 ohms the minimum filter capacitance that can be detected is 500 pF; and for a load resistance of 1 ohm the minimum filter capacitance that can be detected is 5.0 nF.

Estimation of the Filter Components for C-section Filters

In order to estimate the filter components, an estimate of the load resistance $R_L$ must first be made. In the preferred embodiment the source resistance $R_S$ is chosen to be 50 ohms. In practice, the source resistance must be known but need not be 50 ohms. For a low-pass filter at a frequency of 10 kHz, any capacitance of the load $C_L$ of the filter $C_1$ is negligible, and the resistive component $R_L$ of the load may be related using Ohm's Law to the open circuit voltage, the test voltage and the source resistance, which are all either known or measured. The relationship between the open-circuit voltage of the generator $V_{OC}$ and the voltage $V_{LOAD}$ at the filter inputs is given by:

$$\frac{V_{LOAD}}{V_{OC}} = \frac{R_L}{R_S + R_L}. \quad [\text{Equ (2)}]$$

Alternatively, the result can be estimated from the frequency response using the voltage ratio in dB at 10 kHz:

$$dB = 20 \log_{10} \frac{R_L}{R_S + R_L}. \quad [\text{Equ (3)}]$$

By rearrangement:

$$R_L = \frac{XR_S}{(1-X)} \text{ where } X = \text{antilog} \frac{dB_{10kHz}}{20} \quad [\text{Equ (4)}]$$

and $R_L$ can be estimated by the processor.

At low frequencies, regardless of the filter type, the resistance $R_e$ of the capacitor $C_1$ is negligible, and the effective resistance $R_p$ of the filter 4 is related to the source and load resistances $R_S$ and $R_L$ as follows:

$$R_P = \frac{R_L R_S}{(R_L + R_S)}.$$

The load resistance $R_L$ has been calculated, the source resistance $R_S$ is known, and, hence, the effective resistance $R_P$ of the filter may be calculated.

For a C-section filter, the value of the filter capacitance $C_1$ can be calculated from the cut-off frequency and the effective resistance.

In addition, on curve 1–1a, consider point B which is exactly 3 dB lower than $dB_{10kHz}$ (or the lowest measurement frequency). At this point:

$$(C_1 + C_L) = \frac{1}{2\pi F_{3dB} R_P} \quad [\text{Equ (5)}]$$

where:

$(C_1+C_L)$=total circuit capacitance $C_T$ $F_{3dB}$=the frequency at point B $R_P$=effective circuit resistance=

$$R_P = \frac{R_L R_S}{(R_L + R_S)}$$

and hence the total circuit capacitance can be calculated.

Estimation of the Insertion Loss for a C-section Filter

The insertion loss is frequency dependent and in accordance with an aspect of this invention can be deduced from an estimate of the magnitude of the attenuation A of the filter at any frequency. By substituting the known values, the attenuation may be expressed in terms of a frequency response. The insertion loss, $I_L$, may then be estimated. The data processing software, when set to examine a filter of this type, is arranged to calculate the insertion loss from the curve in FIG. 2B. The magnitude of attenuation AdB at any frequency f can be deduced from:

$$A = 20 \log_{10} \frac{1}{\left[\left(1 + \frac{R_S}{R_L}\right)^2 + \omega^2 R_S^2 C_T^2\right]^{\frac{1}{2}}} \quad [\text{Equ (6)}]$$

where $\omega=2.\Pi.f$. The insertion loss $I_L$ at any frequency is given by:

$$I_L = \left[A - 20 \log_{10} \frac{R_L}{R_S + R_L}\right] dB \quad [\text{Equ (7)}]$$

where $R_S$ is known and $R_L$, $C_T$ and A have been calculated from equations (4), (5) and (6) respectively. Writing equations (6) and (7) as a single equation gives:

$$I = 20 \log_{10} \frac{1}{\left[\left(1 + \frac{R_S}{R_L}\right)^2 + \omega^2 R_S^2 C_T^2\right]^{\frac{1}{2}}} - 20 \log_{10}\left[\frac{R_L}{R_L + R_S}\right].$$

It can be useful to arrange that the frequency response is displayed visually on a plot providing a useful way for the operator to judge the result of the test procedure.

L- and T-section Filter Test Procedure

FIG. 3A shows the test set-up for a T-section filter. A T-section filter has two inductors $L_1$ and $L_2$ and one capacitor $C_1$. The inductors are connected in series between one input terminal and one output terminal of the filter, and the capacitor is connected in parallel between the junction between the inductors, on the one hand, and the other of each of the input and output terminals of the filter, on the other. The L-section filter is a special case of the T-section filter and corresponds to inductance $L_2$ having a negligible value and being replaced by a short circuit as shown in FIG. 3B.

FIG. 3C shows the frequency response obtained when serviceable and unserviceable examples of L-section and T-section low-pass L-C filter circuits or circuit elements are tested using the apparatus of FIGS. 3A or 3B. The voltages measured for a serviceable example of L-, or T-, section filter result in a frequency response of the form of solid curve 1 (continued at 1a and 1b) shown in FIG. 3C. The pronounced dip in the log-log plot is characteristic of these types of filters and can be used to identify that the filter is in serviceable condition, free from short-circuit and open-circuit faults.

If the capacitance $C_1$ is open-circuit, then the is frequency response follows curve 1 initially but rises along curve 2a instead of falling along curve 1a, and the characteristic dip is absent. If the inductance $L_1$ is open circuit (i.e. in this connection is of substantially zero inductance, e.g. because the ferrite bead that should provide it has split and fallen off its associated wire), the frequency response initially follows curve 1 and 1a but fails to turn upwards along curve 1b, following instead curve 2b. If the capacitance $C_1$ is short circuit then the response is frequency independent and the characteristic response is replaced by curve 3.

By comparing the measured frequency response with the characteristic frequency response for this type of filter, the operational integrity of the filter can be assessed. In practice, the response may not be as pronounced or clean as the characteristic response. The CPU should therefore desirably be able to detect whether the response is analogous to the characteristic response from imperfect data. It follows from the shape of the frequency response that both L- and T-section filters have cut-off frequencies which can be estimated in the same way as for the C-section filter Estimation of the Cut-off Frequency The test procedure initially follows that of the C-section filter, described above, with open-circuit and test voltages being measured for a range of frequencies. Once the cut-off frequency of the filter has been established, the processor must also establish that the frequency response subsequently rises at higher frequencies in order to verify the characteristic frequency response and operational integrity of the filter.

If the response does not fall by 3 dB or more below the 50 MHz measurement, then the capacitance is open circuit and the filter is defective. In this case, the filter components and insertion loss cannot be estimated. In practice, this would enable an inoperative filter to be replaced.

Verification of the Frequency Response for L- and T-section Filters

In order to establish that the frequency response of the filter is correct, the programmable signal generator 2 should then be set to provide a test signal of the cut-off frequency of the filter. At the cut-off frequency, the test voltage is measured. The processor first checks the ratio of test to open-circuit voltage to ensure that it is 3 dB below the datum value as expected. If the test fails, the processor recalculates the cut-off frequency and retests at the new cut-off frequency until the cut-off frequency is established. On a logarithmic-logarithmic scale, the frequency response of the filter will fall at 20 dB/decade until the effect of the inductors causes the frequency response to rise. Once the cut-off frequency has been established, the shape of the frequency response can be verified by checking that the response subsequently rises. If the response rises the difference in dB between the datum frequency reading and the current frequency reading will be less than the difference between the datum frequency and the previous test frequency reading. Given that the response drops at 20 dB/decade, a threshold can be calculated for any frequency above the cut-off frequency $f_{cutoff}$ which will determine whether the frequency response has begun to rise. The example below uses test frequencies of $3.162 \times f_{cutoff}$, $10 \times f_{cutoff}$, $31.62 \times f_{cutoff}$, and $100 \times f_{cutoff}$.

The processor sets the programmable generator to the frequency given in the first row of Table 1 appended to this description, i.e. $3.162 \times f_{cutoff}$. The processor checks that the voltage in dB at this higher frequency As less than 10 dB ±0.5 dB lower than the-value at the datum frequency, the threshold shown in the second column of Table 1. If the test condition is not met, the programmable generator is set to the next frequency, i.e. $10 \times f_{cutoff}$, measuring the test voltage and converting it to dB. The new reading is compared with the corresponding threshold. For so long-as the condition is not met, the frequency response has not begun to rise and the shape of the filter is unverified. The frequency must be increased and the next threshold used. If different frequencies are used, the thresholds need to be recalculated using the fact that the fall-off is 20 dB/decade to estimate the new thresholds. The test is continued at higher frequencies until the test condition is met. At this frequency the voltage ratio has begun to rise along curve 1b as shown by the characteristic frequency response in FIG. 3C and the shape of the L- or T-section filter has been verified.

Another method of determining the minimum frequency is described below in relation to pi-filters.

If a generator frequency of 50 MHz is reached i.e. the maximum frequency, and the test condition has not been met, then the filter is faulty, and inductance $L_1$ of the T network is open-circuit. On the other hand, if the operation of the T filter is verified, the filter components can then be calculated. Note that it is not possible using this procedure to establish whether inductance $L_2$ is satisfactory.

Estimation of the Filter Component values for L- and T-section Filters

In order to estimate the filter component values, the filter load resistance, $R_L$, must first be estimated. For L- and T-section filters, over the pass-band the resistive component of the inductors and capacitors will be negligible. The load impedance, $Z_L$, is assumed to comprise a parallel combination of resistance $R_L$ and capacitance $C_L$. The inductance of the T filter has two components due to the two inductors $L_1$ and $L_2$. The inductors have associated loss resistances $R_{e1}$ and $R_{e2}$ which are frequency variable. At 10 kHz, these associated loss resistances are negligible, but at frequencies of $F_{3dB}$ and above the resistances are significant. The value of $R_L$ can be calculated as for the C-section filter, e.g. from equation (4).

The total capacitance $C_T$ of the circuit is a function of the effective resistance $R_P$ and can be calculated from equation (8):

$$C_T = \frac{1}{2\pi F_{3dB} R_P} \qquad \text{[Equ (8)]}$$

where:

$$C_T = C_1 + C_L$$

$$R_P = \frac{R_S(R_L + R_{e1} + R_{e2})}{R_S + R_L + R_{e1} + R_{e2}}. \quad \text{[Equ (8)a]}$$

There are too many unknown variables to determine the value of $C_T$ at this stage. In order to proceed the values of $R_{e1}$ and $R_{e2}$ are set to zero, i.e. $R_{e1}=R_{e2}=0$, in order to estimate an interim value for $R_p$. Further information is available from the frequency response by considering the minimum in the frequency response, at frequency $f_{min}$. The minimum of the frequency response is estimated using an inflection algorithm. The inflection algorithm is described below for the pi-section filter. The minimum in the frequency response is caused by the resonance of the inductor $L_1$ and capacitor $C_1$. At this point $L_1$ and $C_1$ are related by equation (9):

$$L_1 = \frac{1}{(2\pi)^2(f_{min})^2 C_1}. \quad \text{[Equ (9)]}$$

In general for a T filter, $C_L$ will be small compared is with $C_1$, in which case $C_T=C_1$ and $C_T$ is given by equation (8). Also the inductors $L_1$ and $L_2$ take the same value, $L_1=L_2$, making $R_{e1}=R_{e2}$ in practice. $R_{e1}$ may be related to the minimum of the frequency response:

$$R_{el} = \frac{DR_S}{(1-D)} \quad \text{[Equ (10)]}$$

where:

$$D = \text{antilog}_{10}\left(\frac{dB \text{ at } f_{min}}{20}\right). \quad \text{[Equ (11)]}$$

Given that the above assumptions hold, a value for $R_{e1}=R_{e2}$ can be used to estimate a new improved value for $C_T$ in Equation (8) and hence new values for $R_{e1}$ and $R_{e2}$. This iterative loop is repeated until successive values of $C_T$ are within a predetermined amount such as 1% of each other, and this is then taken to be the value of component $C_T$. Finally, the values of $L_1=L_2$ can be calculated from equation (9).

Estimation of the Insertion Loss for T- and L-section Filters

The insertion loss $I_L$ of the T filter can be found by calculating:

$$I_L = 20\log_{10}\left[\frac{Z_L Z_3}{Z_2 R_S + Z_2 Z_1 + Z_2 Z_3 + Z_L R_S + Z_L Z_1 + Z_L Z_3 + Z_3 R_S + Z_3 Z_1}\right] -$$

$$20\log_{10}\left[\frac{Z_L}{Z_L + R_S}\right]$$

where:

$Z_1 = R_{e1} + j\omega L_1$ $Z_2 = R_{e2} + j\omega L_2$ $Z_3 = \frac{1}{j\omega C_1}$ $Z_L = R_L$ The insertion loss $I_L$ of the L filter is the same but with $L_2$ set equal to zero. Thus the insertion loss of the L filter can be found by calculating:

$$I_L = 20\log_{10}\left[\frac{Z_L Z_3}{Z_L R_S + Z_L Z_1 + Z_L Z_3 + Z_3 R_S + Z_3 Z_1}\right] - \quad \text{[Equ (17)]}$$

$$20\log_{10}\left[\frac{Z_L}{Z_4 + R_S}\right]$$

$$L = \frac{1}{(2\pi)f_{min}^2(C_2 + C_L)}$$

Pi-section Filter Test Procedure

FIG. 4A shows the test set-up for a pi-section low-pass filter. The pi-section filter 4 has one inductor $L_1$ and two capacitors $C_1$ and $C_2$. Capacitor $C_1$ is connected across the two input terminals and capacitor $C_2$ is connected across the two output terminals. Inductor $L_T$ couples one input terminal to one output terminal, the other of each of the input and output terminals being connected together. The characteristic frequency response is shown in FIG. 4B. The frequency response obtained for serviceable and unserviceable examples of a pi-section low-pass L-C filter circuits or circuit elements are shown. The data given by a serviceable example of such a filter creates a frequency response of the form of solid curve 1 starting at 1a and continued at 1b, 1c and 1d in FIG. 4B, with a noticeable S-shape in this log-log plot. This corresponds to an example of the filter in serviceable condition, free from short-circuit and open-circuit faults. The types of load normally applied to such a filter have little effect on the overall shape of the frequency response, shifting the whole response horizontally or vertically depending on the reactance of the load.

If remote capacitance $C_2$ is open circuit, then the response corresponds to a curve made up of portions 1a, 2a and 1d. If the capacitance $C_1$ is open-circuit then the frequency response approaches that of an L-section filter i.e. with a dip and a rise, following curve 1a, 1b, 1c, and 2b. If the inductance, L or $L_1$, is open circuit, then the frequency response corresponds to curve portions 1a, 1b and 2c. If either capacitance $C_1$ or $C_2$ is short circuit, then the curve is replaced by curve 3. An inductor provided by a ferrite bead threaded around a wire does not generally develop a short-circuit fault, though its inductance may largely disappear if the bead is damaged or missing.

As shown, curve portion 1c has positive slope on FIG. 4B. Depending on the component values, however, it may not be such a sharp inflection and may have a negative slope, which is nevertheless less than the negative slope of curve portions 1b and 1d, which have substantially the same slope. The system will however detect a less-pronounced inflection of such a type.

Figure 5:
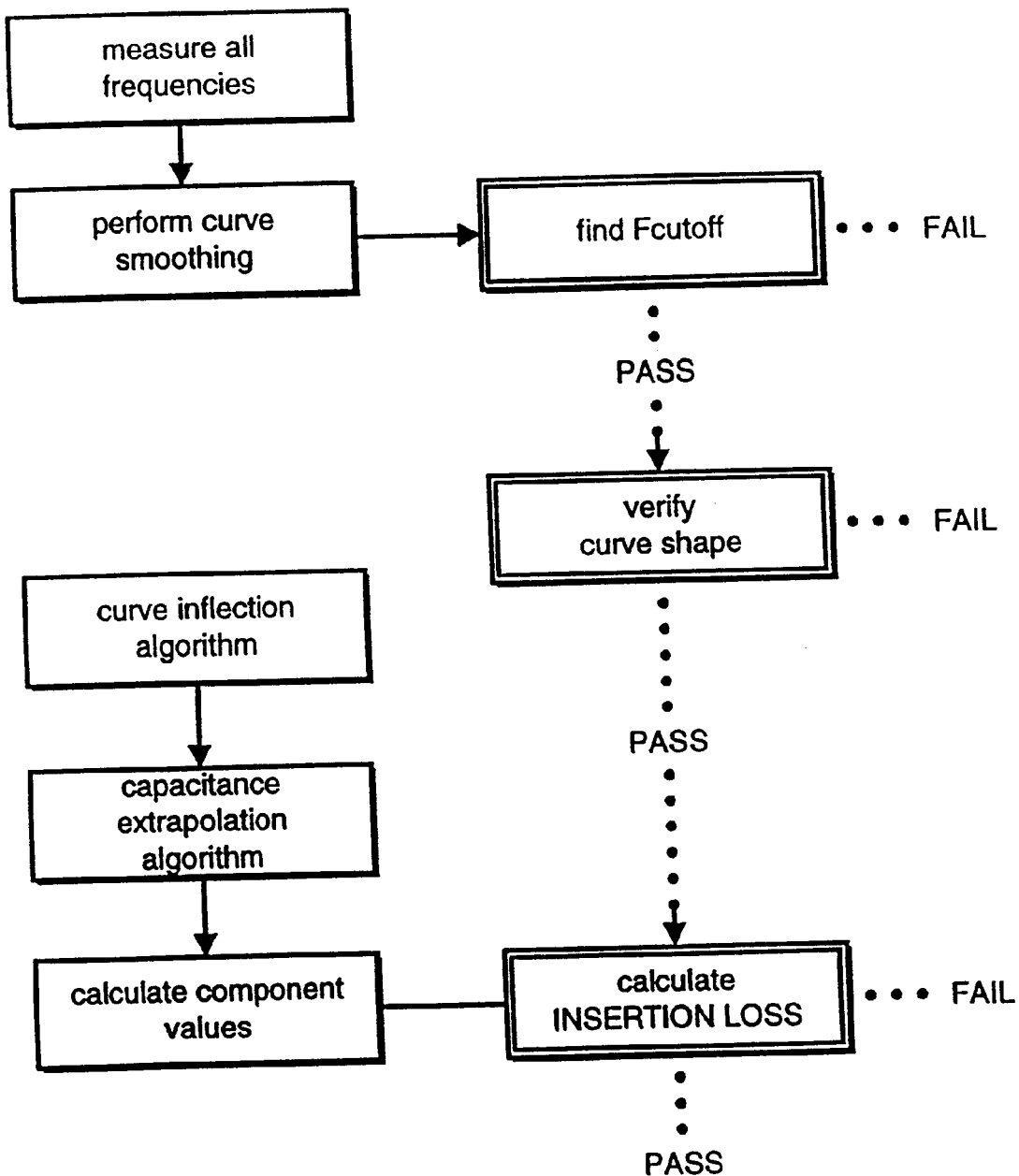
FIG. 5 shows a flowchart for testing a pi-section low-pass filter using the method of the invention.

The steps in verifying the frequency response, and estimating the filter component values and the insertion loss of the filter, are shown in the flowchart of FIG. 5. This flowchart will be self-explanatory to those skilled in the art in conjunction with the above description and a verbal description is not therefore repeated here.

Estimation of the Cut-off Frequency 41

The characteristic response for the pi-section filter is similar to that of the L- or T-section filters at low frequencies and differs in that the response rises and then falls, being effectively characterised by an S-shape. Using the method described above with reference to the C-section filter, the cut-off frequency of the filter is first determined.

Verification of the Frequency Response for a Pi-section Filter

The process for determining that the frequency response rises is the same as for the L- and T-section filters. Once the rise of the frequency response has been detected the fall-off of the response must be verified. Denoting the frequency at which the response begins to rise as $F_{rise}$, the signal generator frequency is increased by a factor of 3.162, for example if $F_{rise}=10\times F_{cutoff}$, then the signal generator frequency is set to $31.62\times F_{cutoff}$. At this new frequency, the difference in dB between the previous value and the current value should be greater than 10 dB, with the current value being more than 10 dB lower than the previous value. If this condition is met, the filter is functional. If the new value falls short of being 10 dB higher than the previous value, then capacitor $C_1$ is open-circuit.

Once the frequency response has been verified, i.e. the shape of the response has been shown mathematically to correspond to the characteristic shape of the particular filter, the component values of the filter may be estimated.

Estimation of the Filter Component Values for a pi-section Filter

The filter load impedance is assumed to comprise a parallel combination of resistance $R_L$ and capacitance $C_L$. The inductance of the pi filter comprises an inductor $L_1$, and associated loss resistance $R_e$ which is frequency dependent and which is negligible at 10 kHz, but which has a significant value at $F_{3dB}$ and above.

The value of $R_L$ is estimated in the same manner as for C-, L- and T-section filters using the 10kHz datum frequency test data and Equation (4). The total capacitance of the circuit is given by:

$$C_T = \frac{1}{2\pi F_{3dB} R_P} \qquad [\text{Equ (12)}]$$

where:

$$R_P = \frac{R_S(R_L + R_e)}{R_S + R_L + R_e} \qquad [\text{Equ (12a)}]$$

$$C_T = C_1 + C_2 + C_L$$

Note that, at this stage of computation, $R_e$ at $F_{3dB}$ is unknown and a value of $R_e=0$ is used to obtain an interim value of $R_P$.

Estimation of the Inflection Points for a pi-section Filter

Further information is available in the inflection points of the frequency response. A curve inflection derivation method is used which is based on the difference in the voltage ratio between the open-circuit and test voltages in dB at different frequencies. In practice, 131 test frequencies, equally spaced on a logarithmic scale, are used in the measurement of the test voltage and subsequent calculation of the dB level at the test voltage. The results are placed in an array in frequency order and then smoothed using a window length of 5 samples. The first and last two samples remain unchanged in the array due to the window length. Once smoothed, the inflection points of the array must be estimated. For regularly spaced frequency readings, the slope of the curve is given by the difference in dB between any two of the readings. In practice, a smoothing window length of 7 samples is used, i.e. samples n and (n+7) are used, hence:

$$dy/dx=(dB[n]-dB[n+7])/7.$$

A new array is used to store the difference values, with the first and last three entries being null due to the length of the difference window chosen. Inflection point C, which as shown in the minimum in the curve, is estimated by determining the lowest frequency at which the difference value falls below the average of all the difference values. The minimum frequency of an L- or T-section filter frequency response may also be calculated in this manner. Inflection point D, which as shown in the subsequent peak, is then estimated as the first entry in the difference array after point C which is greater than the average value. At point C denote the dB level=$dB_{(fmin)}$, and frequency=$f_{min}$. At point D denote the dB level=$dB_{(fmax)}$ and the frequency=$f_{max}$.

Using the fact that the frequency response drops at 20 dB/decade for a C-section filter, the test data may now be extrapolated to estimate a point F. The value in dB at point D is used to establish a point E on curve portion 1d of FIG. 4B which has a value 3 dB lower than point D:

$$dB_E=(dB_{(fmax)}-3)$$

where the frequency at this point E is denoted $f_b$.

The position of the point F, corresponding to a frequency on curve portion 2c of FIG. 4B with the same value in dB as point E, has a frequency $f_a$, the attenuated frequency, where:

$$f_a=F_{3dB}\times A \qquad [\text{Equ 13}]$$

where:

$$A=\text{antilog}_{10}\{(dB_{10kHz}-dB_E)/20\}.$$

The processor then estimates the extrapolated frequency ratio k where:

$$k = \frac{f_b}{f_a} \qquad [\text{Equ (14)}]$$

and calculates the value of the first capacitance $C_1$ from:

$$C_1 = \frac{C_T}{k} \qquad [\text{Equ (15)}]$$

In general, for pi filters, $C_1=C_2$, that is both internal capacitances are equal. In this case:

$$C_L=C_T-2C_1 \qquad [\text{Equ (16)}]$$

At the first minimum after $F_{3dB}$, that is at $f_{min}$, the inductance L is in resonance with $(C_2+C_L)$. Hence, the effective inductance of the circuit is given by:

$$L = \frac{1}{(2\pi)f_{min}^2(C_2 + C_L)} \qquad [\text{Equ (17)}]$$

Also at this frequency $f_{min}$ it is possible to derive an equation for $R_e$:

$$R_e = \frac{BR_S}{[(1-B)^2 + B^2\omega^2 C_1^2 R_S^2]^{\frac{1}{2}}} \qquad [\text{Equ (18)}]$$

where:

$$\omega=2\Pi f_{min}$$

$$B = \text{antilog}_{10}\left[\text{dB's at } \frac{f_{min}}{20}\right]$$ [Equ (19)]

Figure 6:
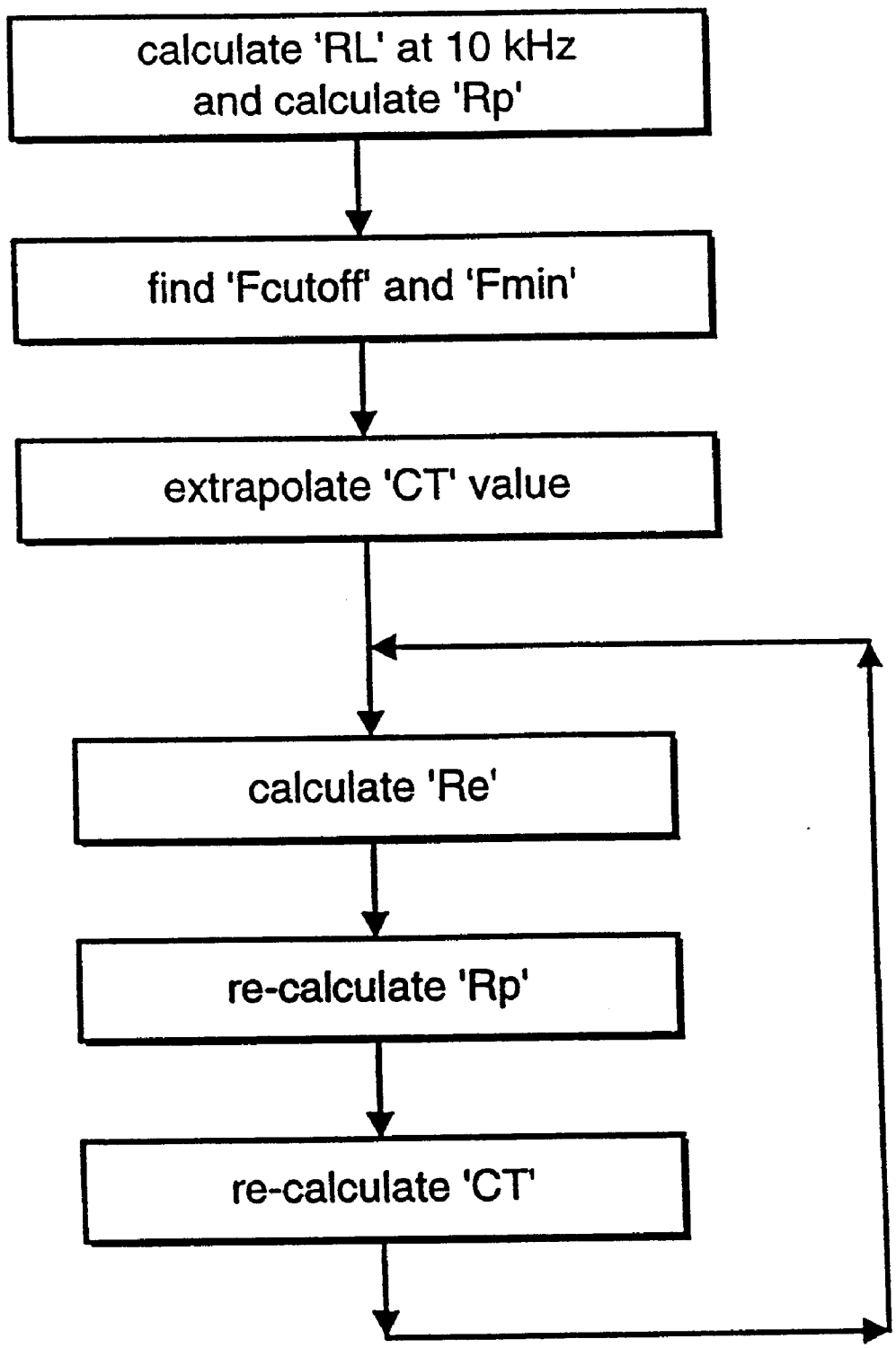
FIG. 6 shows a flowchart for calculating the total capacitance of a pi-section filter.

The processor now replaces the initial value for $R_e$ in equation (12a) to give a new value for $C_T$ in equation (12) and hence a new value for $C_1$ in equation (15) and a new value for $R_e$ in equation (18). This interactive loop is repeated until successive values of $C_T$ are within a predetermined amount such as 1% of each other. FIG. 6 shows a flowchart corresponding to the estimation of $C_T$ as described above. As with FIG. 5, a verbal description of this Figure is unnecessary.

Estimation of the Insertion Loss of a pi-section Filter

The insertion loss $I_L$ of the Pi filter is given by:

$$I_L = 20\log_{10}\frac{Z_L(Z_1^2 Z_3 + Z_1 Z_3^2 + Z_1 Z_2 Z_3)}{P}$$

where:

$$P = R_S[Z_1^2 Z_3 + 2Z_1 Z_2 Z_3 + Z_2^2 Z_3 + Z_1 Z_3^2 + Z_2 Z_3^2] +$$ [Equ (20)]
$$R_S Z_L[Z_1^2 + 2Z_1 Z_2 + 2Z_1 Z_3 + Z_2^2 + 2Z_2 Z_3 + Z_3^2] +$$
$$Z_L[Z_1^2 Z_2 + Z_1 Z_2^2 + 2Z_1 Z_2 Z_3 + Z_1^2 Z_3 + Z_1 Z_3^2] +$$
$$Z_1^2 Z_2 Z_3 + Z_1 Z_2^2 Z_3 + Z_1 Z_2 Z_3^2$$

and where:

$$Z_1 = \frac{1}{j\omega C_1}$$
$$Z_2 = R_e + j\omega L_e$$
$$Z_3 = \frac{1}{j\omega(C_L + C_2)}$$
$$Z_L = R_L.$$

Extension to other Filter Characteristics

In the case of high-pass L-C filters that respectively correspond in configuration to the low-pass filters of FIGS. 2 to 4 after changing L components to C components and vice versa, the forms of the log-log characteristic curves are for many purposes substantially similar except for the reversal of the log-frequency scale, i.e. in the case of the high-pass filters the low-frequency end is to the right of each plot instead of to the left.

Several other types of filter show other characteristic data patterns and differences between serviceable and faulty examples, as may be ascertained by the reader skilled in the art by using apparatus embodying the present invention, e.g. that of FIG. 1, to obtain data and curves corresponding to those of FIGS. 2B, 3C and 4B in the case of each of several filter types that may be of interest, using serviceable and faulty examples.

In addition to the use of the test system and method as described to detect fault conditions such as short circuits and open circuits, and component values, the system and method can also be used to detect other characteristics of filters or circuit elements under test. For example, also detectable are changes, e.g. by way of deterioration, with time, and/or with use-or wear, of the component values in such filters or circuit elements, or changes in value of the load impedances connected to such elements.

Where alternative measurement circuit arrangements are used, e.g. current measurement or use of a high-impedance constant-current source, corresponding changes generally need to be made in handling the forms of data that result, as will be appreciated by the skilled reader.

The present invention is susceptible to many other modifications and variations and the present disclosure extends to other combinations and subcombinations of the features mentioned above and illustrated in the drawings.

TABLE 1

| Test Frequency | Test voltage ratio |
| --- | --- |
| 10 kHz (datum frequency) | $V_{filter}$ |
| $f_{cut\text{-}off}$ | $V_{filter}$ - 3 dB |
| $f_{cut\text{-}off} \times 3.162$ | $V_{filter}$ - 10 dB |
| $f_{cut\text{-}off} \times 10$ | $V_{filter}$ - 20 dB |
| $f_{cut\text{-}off} \times 31.62$ | $V_{filter}$ - 30 dB |
| $f_{cut\text{-}off} \times 100$ | $V_{filter}$ - 40 dB |
| $f_{cut\text{-}off} \times 316.2$ | $V_{filter}$ - 50 dB |
| $f_{cut\text{-}off} \times 1000$ | $V_{filter}$ - 60 dB |

What is claimed is:

1. A method of estimating component values of an operational L-section low-pass filter having input and output connections, the output connections being connected to a load, comprising the steps of:

(a) providing an L-section low pass filter as a circuit to be tested;

(b) applying a test signal from a signal source to the input connections of the L-section filter, the signal source having a known source resistance $R_S$;

(c) varying the frequency of the test signal over a range of test frequencies;

(d) measuring over the range of test frequencies voltages developed across the input connections of the L-section filter, and using the frequencies and the associated voltages to form measured data pairs;

(e) estimating load resistance $R_L$, of the load applied to the filter;

(f) estimating the 3 dB frequency $F_{3\ dB}$ of the filter;

(g) making an initial estimate of effective resistance $R_P$, by assuming loss resistance $R_{e1}$ for an inductor having inductance $L_1$ equals zero in the equation:

$$R_P = \frac{R_S(R_L + R_{e1})}{R_S + R_L + R_{e1}};$$

(h) making an initial estimate of total capacitance $C_T$ using the initial estimate of $R_P$:

$$C_T = \frac{1}{2\pi F_{3dB} R_P};$$

(i) estimating the frequency $f_{min}$ of an inflection point of the frequency response;

(j) making a first estimate of the loss resistance $R_{e1}$ associated with the inductor having inductance $L_1$ at the minimum frequency in accordance with the equation:

$$R_{e1} = \frac{DR_S}{1-D}$$

where:

$$D = \text{antilog}_{10}\left(\frac{\text{dB at } f_{\min}}{20}\right);$$

(k) improving the estimate of the effective resistance $R_P$ using the new estimate for $R_{e1}$ in the equation in step (g); and (l) improving the estimate for total capacitance $C_T$ from the equation in step (h).

2. A method of estimating the component values of an operational L-section low-pass filter according to claim 1, wherein the step of estimating the resistance of the load resistance comprises estimating the load resistance $R_L$ using the equation:

$$R_L = \frac{R_s V_{low}}{V_{oc} - V_{low}};$$

where $V_{low}$ is the voltage measured at the lowest frequency, and $V_{oc}$ is the open-circuit voltage.

3. A method of estimating the component values of an operational L-section low-pass filter according to claim 1, wherein the step of estimating the resistance of the load resistance comprises estimating the load resistance $R_L$ using the equation:

$$R_L = \frac{X R_S}{(1-X)} \text{ where } X = \text{antilog} \frac{\text{dB}_{low}}{20}$$

and $\text{dB}_{low}$ is the voltage ratio in decibels at a predetermined low frequency.

4. A method of estimating the component values of an operational L-section low-pass filter according to claim 1 including the step of using $f_{min}$ to calculate the inductance $L_1$, in terms of filter capacitance $C_1$ using the equation:

$$L_1 = \frac{1}{(2\pi)^2 (f_{\min})^2 C_1}.$$

5. A method of estimating the component values of an operational L-section low-pass filter according to claim 1 including the steps of:

(a) estimating $$Z_1 = R_{e1} + j\omega L_1$$

where $Z_1$ is the impedance of the inductor;

b) estimating $$Z_3 = \frac{1}{j\omega C_1}$$

where $Z_3$ is the reactance of a capacitor having capacitance $C_1$;

c) estimating $$Z_L = R_L$$

where $Z_L$ is the impedance of the load;

(d) estimating the insertion loss of the filter $I_L$, from the filter components as:

$$I_L = 20 \log_{10}\left[\frac{Z_L Z_3}{Z_L R_S + Z_L Z_1 + Z_L Z_3 + Z_3 R_S + Z_3 Z_1}\right] - 20 \log_{10} \frac{Z_L}{Z_L + R_S}.$$

6. Apparatus for estimating component values of an operational L-section low-pass filter having input and output connections, the output connections being connected to a load, comprising:

(a) a signal source for applying a test signal to the input connections of the L-section filter, the signal source having a known source resistance $R_S$;

(b) means for varying the frequency of the test signal over a range of test frequencies;

(c) a meter for measuring over the range of test frequencies voltages developed across the input connections of the L-section filter, and using the frequencies and the associated voltages to form measured data pairs;

(d) means for estimating load resistance $R_L$ of the load applied to the filter;

(e) means for estimating the 3 dB frequency $F_{3\,dB}$ of the filter;

(f) means for making an initial estimate of effective resistance $R_P$, by assuming loss resistance $R_{e1}$ for an inductor equals zero in the equation:

$$R_P = \frac{R_S(R_L + R_{e2})}{R_S + R_L + R_{e1}};$$

(g) means for making an initial estimate of the total capacitance $C_T$ using the initial estimate of $R_P$:

$$C_T = \frac{1}{2\pi F_{3dB} R_P};$$

(h) means for estimating the frequency $f_{min}$ of an inflection point of the frequency response;

(i) means for making a first estimate of the loss resistance $R_{e1}$ associated with the inductor having inductance $L_1$ at the minimum frequency in accordance with the equation:

$$R_{e1} = \frac{D R_S}{1-D}$$

where:

$$D = \text{antilog}_{10}\left(\frac{\text{dB at } f_{\min}}{20}\right);$$

(j) means for improving the estimate of the effective resistance $R_P$, using the new value for $R_{e1}$; and (k) means for improving the estimate for total capacitance $C_T$.

7. Apparatus for estimating the component values of an operational L-section low-pass filter according to claim 6, including means for using $f_{min}$ to calculate the inductance $L_1$, in terms of filter capacitance $C_1$:

$$L_1 = \frac{1}{(2\pi)^2 (f_{\min})^2 C_1}.$$

8. Apparatus for estimating the component values of an operational L-section low-pass filter according to claim 7, including means for:

(a) estimating $$Z_1 = R_{e1} + j\omega L_1$$

where $Z_1$ is the impedance of the inductor $L_1$;

(b) estimating $$Z_3 = \frac{1}{j\omega C_1}$$

where $Z_3$ is the reactance of the filter capacitance;

(c) estimating $$Z_L = R_L$$

where $Z_L$ is the impedance of the load;

(d) estimating the insertion loss of the filter $I_L$ from the filter components as:

$$I_L = 20 \log_{10}\left[\frac{Z_L Z_3}{Z_L R_S + Z_L Z_1 + Z_L Z_3 + Z_3 R_S + Z_3 Z_1}\right] - 20 \log_{10}\frac{Z_L}{Z_L + R_S}.$$

9. Apparatus for estimating component values of a L-section filter having filter output connections connected to a load, comprising:

(a) a signal source for applying a test signal to input connections of the filter;

(b) means for varying the frequency of the test signal over a range of test frequencies;

(c) a meter for measuring over the range of test frequencies voltages developed across the input connections of the filter, and using the frequencies and the associated voltages to form measured data pairs;

(d) means for estimating load resistance $R_L$ of the load applied to the filter;

(e) means for making an initial estimate of effective circuit resistance $R_P$;

(f) means for making an initial estimate of total capacitance $C_T$;

(g) means for estimating the frequency $f_{min}$ of an inflection point of the frequency response;

(h) means for making a first estimate of loss resistance $R_e$ associated with an inductor in the filter at the minimum frequency;

(i) means for iteratively improving the estimate of the effective resistance $R_P$; and (j) means for iteratively improving the estimate for the total capacitance $C_T$.

* * * * *

UNITED STATES PATENT AND TRADEMARK OFFICE
CERTIFICATE OF CORRECTION

PATENT NO. : 6,411,101 B1  
APPLICATION NO. : 09/952599  
DATED : June 25, 2002  
INVENTOR(S) : Moore Page 1 of 1

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (10) days Delete the phrase "by 10 days" and insert -- by 24 days --

Signed and Sealed this

Twenty-second Day of December, 2009

David J. Kappos  
*Director of the United States Patent and Trademark Office*